(12) United States Patent
Wickersham

(10) Patent No.: US 9,543,457 B2
(45) Date of Patent: Jan. 10, 2017

(54) METHOD AND SYSTEM FOR MANUFACTURING BACK CONTACTS OF PHOTOVOLTAIC DEVICES

(71) Applicant: First Solar, Inc., Perrysburg, OH (US)

(72) Inventor: Charles Edward Wickersham, Columbus, OH (US)

(73) Assignee: First Solar, Inc., Perrysburg, OH (US)

( * ) Notice: Subject to any disclaimer, the term of this patent is extended or adjusted under 35 U.S.C. 154(b) by 317 days.

(21) Appl. No.: 14/041,357

(22) Filed: Sep. 30, 2013

(65) Prior Publication Data

US 2014/0090704 A1   Apr. 3, 2014

Related U.S. Application Data

(60) Provisional application No. 61/707,183, filed on Sep. 28, 2012.

(51) Int. Cl.
| | |
|---|---|
| *H01L 31/0224* | (2006.01) |
| *H01L 31/073* | (2012.01) |
| *H01L 31/18* | (2006.01) |
| *H01L 31/20* | (2006.01) |
| *C30B 1/02* | (2006.01) |
| *C30B 1/12* | (2006.01) |
| *C30B 29/48* | (2006.01) |

(52) U.S. Cl.
CPC ....... *H01L 31/022441* (2013.01); *C30B 1/023* (2013.01); *C30B 1/12* (2013.01); *C30B 29/48* (2013.01); *H01L 31/022425* (2013.01); *H01L 31/073* (2013.01); *H01L 31/1872* (2013.01); *H01L 31/20* (2013.01); *Y02E 10/543* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 4,315,796 A | 2/1982 | Nishizawa et al. | |
| 4,783,379 A | 11/1988 | Wickersham et al. | |
| 5,738,731 A | 4/1998 | Shindo et al. | |
| 5,871,580 A | 2/1999 | Asahi et al. | |
| 7,982,296 B2 | 7/2011 | Nuzzo et al. | |
| (Continued) | | | |

FOREIGN PATENT DOCUMENTS

| | | |
|---|---|---|
| WO | 0214571 A2 | 2/2002 |
| WO | 2005026404 A2 | 3/2003 |
| (Continued) | | |

OTHER PUBLICATIONS

Chu, T. et al., "Thin Film II-VI Photovotaics," Solid-State Electronics, Mar. 1995, pp. 533-549, vol. 38, Issue 3.

*Primary Examiner* — Seahvosh Nikmanesh
(74) *Attorney, Agent, or Firm* — Fraser Clemens Martin & Miller LLC; Michael E. Dockins

(57) ABSTRACT

A method for manufacturing a photovoltaic device includes a step of depositing one of an amorphous layer of ZnTe and a multilayer stack of Zn and Te adjacent a semiconductor layer. The one of the amorphous layer and the multilayer stack is then subjected to an energy impulse at a temperature equal to or greater than its critical temperature. The energy impulse results in an explosive crystallization to form a polycrystalline layer of ZnTe from the one of the amorphous layer and the multilayer stack.

14 Claims, 4 Drawing Sheets

(56) References Cited

U.S. PATENT DOCUMENTS

2008/0251119 A1 10/2008 Forehand
2008/0305573 A1 12/2008 Sterzel
2009/0130795 A1* 5/2009 Im .......................... C30B 13/24
                                                                 438/89
2011/0155207 A1 6/2011 Singh

FOREIGN PATENT DOCUMENTS

WO      03078704 A1   9/2003
WO    2005071135 A2   8/2005

* cited by examiner

METHOD AND SYSTEM FOR MANUFACTURING BACK CONTACTS OF PHOTOVOLTAIC DEVICES

FIELD OF THE INVENTION

The present disclosure relates to photovoltaic devices and, more particularly, to a method and system for manufacturing back contacts for photovoltaic devices.

BACKGROUND OF THE INVENTION

Photovoltaic modules, devices, or cells, can include multiple layers (or coatings) created on a substrate (or superstrate). For example, a photovoltaic device can include a barrier layer, a transparent conductive oxide layer, a buffer layer, and a semiconductor layer formed in a stack on a substrate. Each layer may in turn include more than one layer or film. For example, a semiconductor window layer and a semiconductor absorber layer together can be considered a semiconductor layer. Additionally, each layer can cover all or a portion of the device and/or all or a portion of a layer or a substrate underlying the layer. For example, a "layer" can include any amount of any material that contacts all or a portion of a surface. Cadmium telluride has been used for the semiconductor layer because of its optimal band structure and a low cost of manufacturing.

In order to electrically connect the photovoltaic device, a back contact layer can also be used. The back contact layer can include an electrically conductive material deposited onto the semiconductor layer. The back contact material is typically a metal selected for sufficient adhesion to the semiconductor window layer and minimal formation of a back contact barrier that can affect the current-voltage characteristics of the photovoltaic device. The back contact material is critical to photovoltaic device performance.

A known back contact material for photovoltaic devices includes polycrystalline zinc telluride. A formation of the polycrystalline zinc telluride has been performed by sputter deposition of zinc and telluride targets in a furnace at high temperatures, for example, above 280° C. The process of forming polycrystalline zinc telluride at high temperatures in a furnace is undesirably expensive, and increases a complexity in manufacturing the photovoltaic device. Other means for forming the polycrystalline zinc telluride have included epitaxial growth at lower temperatures by molecular beam epitaxy, another process which is also expensive and time consuming.

There is a continuing need for a low cost method for producing large area back contact layers of polycrystalline zinc telluride for photovoltaic modules. Desirably, the method is conducted at ambient temperature and minimizes a complexity in manufacturing photovoltaic modules.

SUMMARY OF THE INVENTION

In concordance with the instant disclosure, a low cost method for producing large area back contact layers of polycrystalline zinc telluride for photovoltaic modules, at ambient temperature, and which minimizes a complexity in manufacturing photovoltaic modules, is surprisingly discovered.

The invention includes a method of using explosive crystallization to form a polycrystalline film of ZnTe from an amorphous layer of ZnTe, or from a multilayer stack of alternating layers of Zn and Te. Explosive crystallization is a self-sustaining conversion from a highly unordered amorphous phase to an ordered polycrystalline phase due to the difference in enthalpy and melting temperature between the amorphous and crystalline phases. Explosive crystallization occurs by rapid propagation of a heat wave generated from the heat of crystallization ($H_c$) through the material.

Using the method of the invention, a back contact layer on a CdTe semiconductor layer of a photovoltaic module may be metalized with the polycrystalline film of ZnTe. The amorphous layer of ZnTe may be initially provided by a sputter deposition process at room temperature, which is cost effective. The method is also very fast and convenient for transforming large surface areas of photovoltaic devices. The method can also be performed in a vacuum, the same conditions by which the CdTe semiconductor layer of the photovoltaic device is deposited.

The creation of a polycrystalline ZnTe back contact layer using thin film deposition processes at room temperature is important for improved efficiency and manufacturing of lower cost photovoltaic devices. Sputter deposition at room temperature produces an amorphous ZnTe layer. The present disclosure describes how to convert the amorphous ZnTe layer into a polycrystalline ZnTe back contact layer by using explosive crystallization.

An alternative method is to deposit the ZnTe layer as a multilayer stack of alternating layers of Zn and Te, and explosively crystallize the multilayer stack to form the polycrystalline ZnTe back contact layer. For the multilayer stack, the explosive crystallization is driven by the $H_c$ as well as the heat of formation for the pure elements ($\Delta H_f$). The more the exothermic energy in the system, the thinner the film can be for explosive crystallization. For example, in a multilayer stack of Zn and Te, the $\Delta H_f$ is −119 kJ/mole. Heat of crystallization for ZnTe is 56 kJ/mole. Thus, the total energy available for explosive crystallization in Zn/Te multilayer is 175 kJ/mole. Accordingly, the multilayer stack may be used for thin films and amorphous ZnTe may be used for thicker ZnTe layers to form polycrystalline ZnTe back contacts using room temperature sputter deposition processes.

In one embodiment, a method for manufacturing a photovoltaic device includes a step of depositing one of an amorphous layer of ZnTe and a multilayer stack of Zn and Te adjacent a semiconductor layer. The one of the amorphous layer and the multilayer stack is then subjected to an energy impulse at a temperature equal to or greater than its critical temperature. The energy impulse results in an explosive crystallization to form a polycrystalline layer of ZnTe from the one of an amorphous layer and the multilayer stack.

In a further embodiment, a photovoltaic device includes a semiconductor layer with a back contact layer disposed thereon. The back contact layer includes a polycrystalline layer of ZnTe formed by explosive crystallization of one of an amorphous layer of ZnTe and a multilayer stack of Zn and Te deposited on the semiconductor layer.

In another embodiment, a system for manufacturing a photovoltaic device includes a chamber for holding a semiconductor layer under a vacuum. A thin film deposition subsystem is configured for depositing one of an amorphous layer of ZnTe and a multilayer stack of Zn and Te adjacent the semiconductor layer. The system further includes an energy impulse generator for subjecting the one of the amorphous layer and the multilayer stack to an energy impulse at a temperature equal to or greater than its critical temperature. The energy impulse generator causes an explosive crystallization of the one of the amorphous layer and the multilayer stack to form a polycrystalline layer of ZnTe.

DRAWINGS

The above, as well as other advantages of the present disclosure, will become readily apparent to those skilled in the art from the following detailed description, particularly when considered in the light of the drawings described hereafter.

Figure 3:
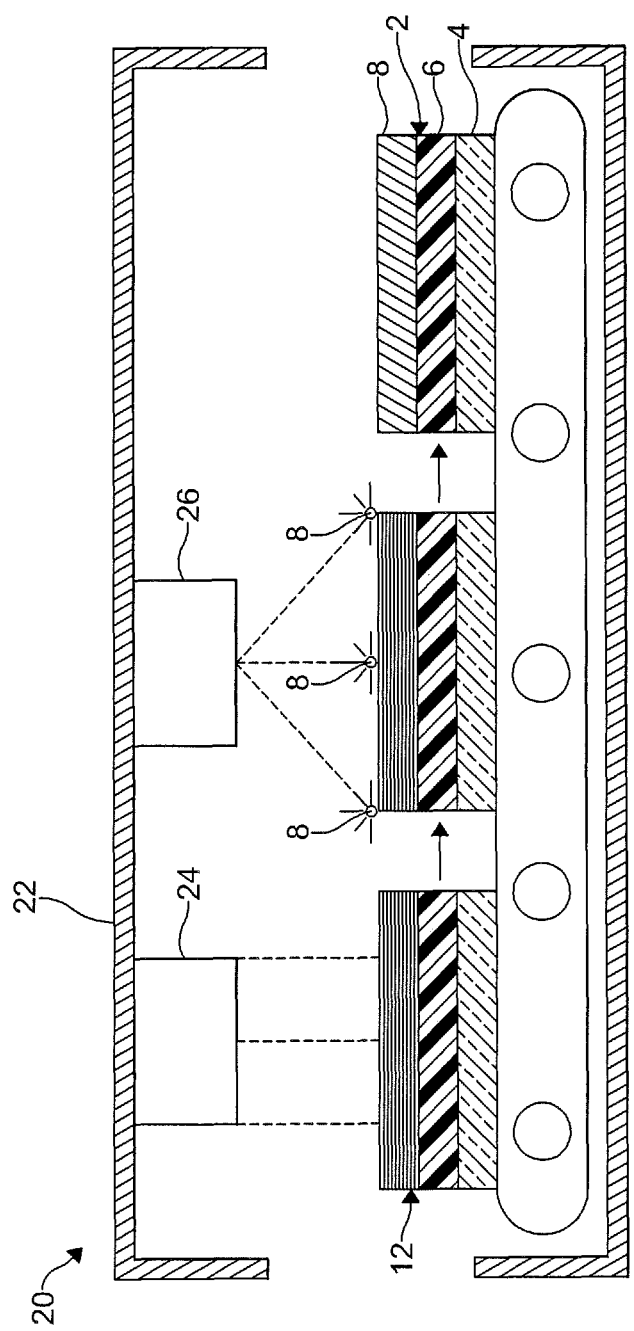
Figure 4:
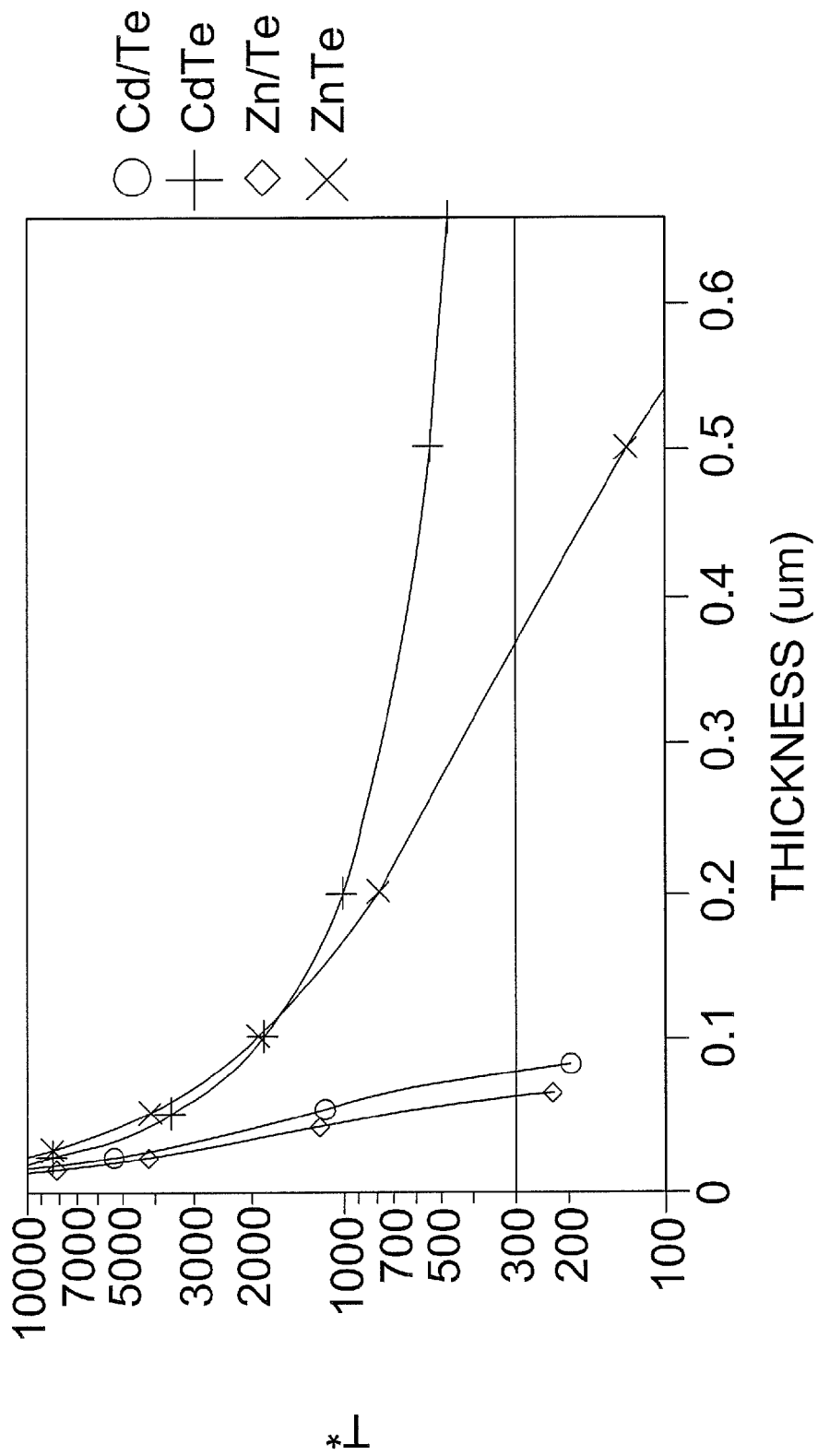

FIG. 3 is a schematic side view illustrating a method for manufacturing photovoltaic devices according to another embodiment of the disclosure, including explosive crystallization of a multilayer stack of zinc and telluride; and FIG. 4 shows a curve illustrating critical temperatures for explosive crystallization relative to layer thickness for various films according to a method of the present disclosure.

DETAILED DESCRIPTION OF THE INVENTION

The following description is merely exemplary in nature and is not intended to limit the present disclosure, application, or uses. It should also be understood that throughout the drawings, corresponding reference numerals indicate like or corresponding parts and features. In respect of the methods disclosed, the order of the steps presented is exemplary in nature, and thus, is not necessary or critical unless recited otherwise.

As shown in FIGS. 1-4, the present disclosure includes a system 20 and a method 100 for manufacturing a photovoltaic device 2. The photovoltaic device 2 has multiple layers including a glass substrate (or superstrate) 4, a semiconductor layer 6, and a back contact layer 8. For purposes of simplicity in illustrating the invention, only the substrate 4, the semiconductor layer 6, and the back contact layer 8 are shown in the drawings. However, one of ordinary skill in the art should understand that one or more additional layers including, but not limited to, a barrier layer, a transparent conductive oxide layer, a buffer layer, and a semiconductor window layer, formed from the same or different materials, may also be used in the photovoltaic device 2 of the present disclosure.

The substrate 4 of the photovoltaic device 2 can include a layer of glass. The semiconductor layer 6 can include a bi-layer, which may include an n-type semiconductor window layer, and a p-type semiconductor absorber layer. The n-type semiconductor window layer may include cadmium sulfide (CdS). The p-type semiconductor absorber layer may include cadmium telluride (CdTe). Other suitable materials for the substrate 4 and the semiconductor layer 6 may also be used, as desired.

In order to electrically connect the photovoltaic device 2 to another device or system, the back contact layer 8 includes polycrystalline zinc telluride (ZnTe). The back contact layer 8 of the present disclosure is formed by explosive crystallization of one of an amorphous layer 10 of ZnTe (shown in FIG. 2) and a multilayer stack 12 of Zn and Te (shown in FIG. 3). The multilayer stack 12 of Zn and Te includes different layers of amorphous Zn and amorphous Te alternating in a stack. The term "amorphous", as used herein, does not preclude the presence of at least some crystallization or order in the layer upon deposition, but instead indicates that the layer contains an amorphous component.

Furthermore, although explosive crystallization of ZnTe is used herein as an example, one of ordinary skill in the art should understand that back contact layers 8 formed by explosive crystallization of other suitable amorphous back contact materials may also be conducted within the scope of the present disclosure.

Figure 1:
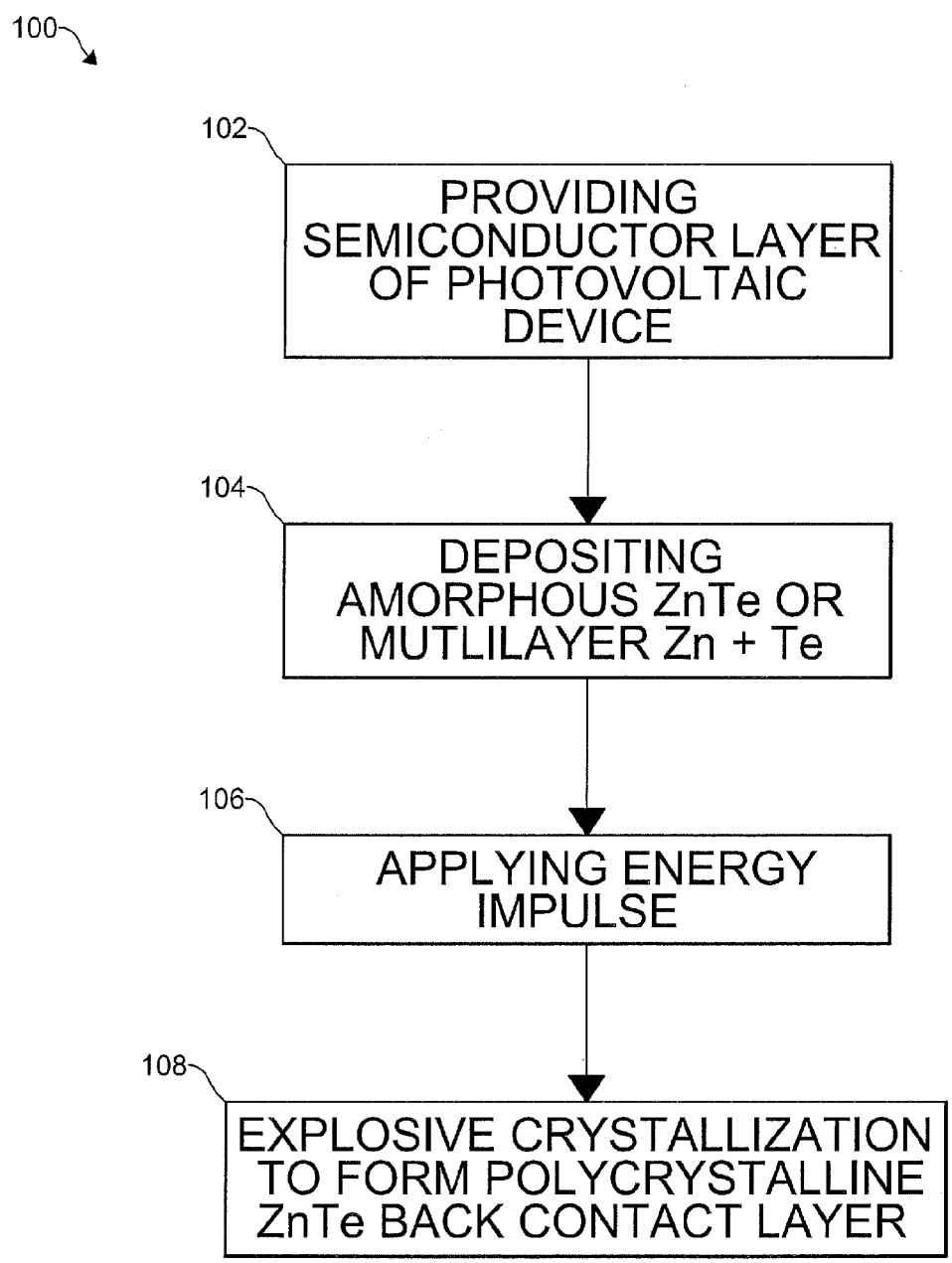
FIG. 1 is a flow diagram illustrating the method for manufacturing photovoltaic devices according to the present disclosure.

Referring to FIG. 1, the method 100 includes a step 102 of providing the semiconductor layer 6 of the photovoltaic device 2. The semiconductor layer 6 may be provided by deposition of the semiconductor layer 6 adjacent the substrate 4. The semiconductor layer 6 may be deposited using any suitable deposition method including, as nonlimiting examples, sputtering, vapor transport deposition, and closed space sublimation. In particular embodiments, the semiconductor layer 6 is deposited at a rate and under a temperature sufficient to provide polycrystalline CdTe. One of ordinary skill in the art may select suitable types, rates, and temperatures of deposition for the semiconductor layer 6, as desired.

The method 100 further includes a step 104 of depositing the one of the amorphous layer 10 and the multilayer stack 12 adjacent the semiconductor layer 6. The deposition of either the amorphous layer 10 or the multilayer stack 12 is preferably performed at a low temperature and a high rate of deposition in order to optimize the amount of amorphous ZnTe present in the amorphous layer 10, and the amount of amorphous Zn and Te present in the alternating layers of Zn and Te of the multilayer stack 12. The amorphous layer 10 or the multilayer stack 12 is deposited substantially uniformly on the semiconductor layer 6, in order to maintain a substantially constant free energy of the deposited one of the amorphous layer 10 and the multilayer stack 12 across a surface area thereof.

Figure 2:
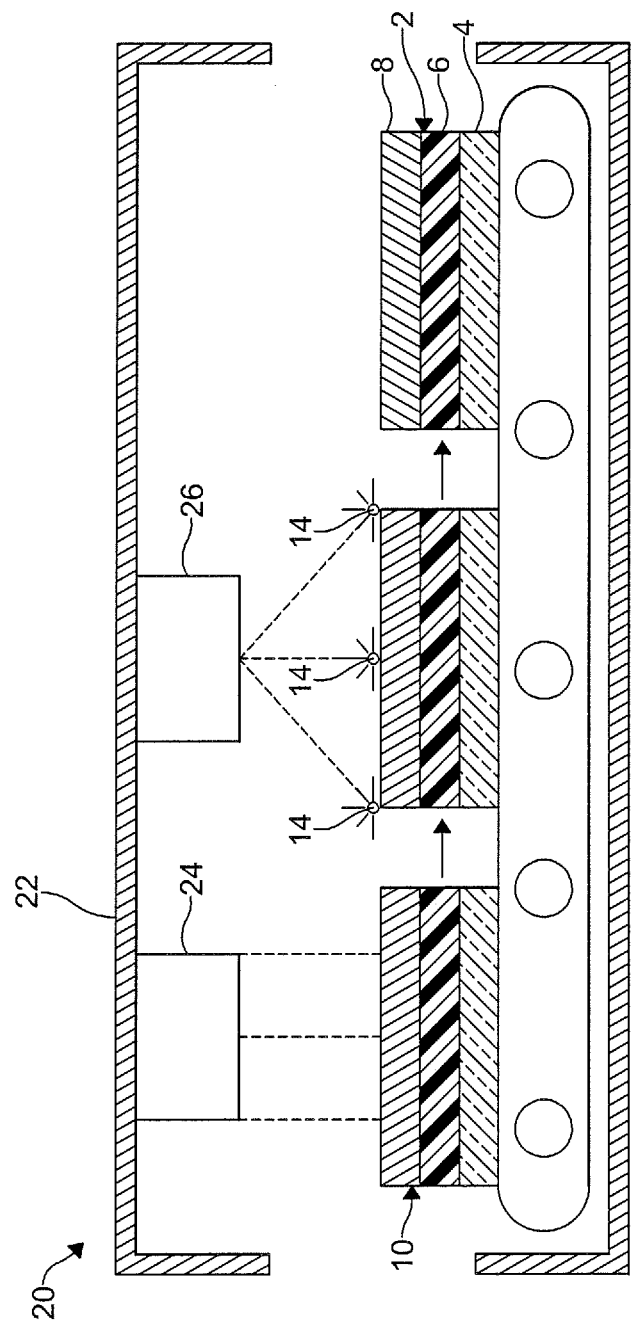
FIG. 2 is a schematic side view illustrating a method for manufacturing photovoltaic devices according to one embodiment of the disclosure, including explosive crystallization of an amorphous layer of zinc telluride.

As a nonlimiting example, depicted in FIGS. 2 and 3, the deposition of one of the amorphous layer 10 and the multilayer stack 12 may be performed by a thin film deposition subsystem 24 at ambient temperature, and under a vacuum in a chamber 22. The term "ambient temperature" is used herein to refer to the temperature at which the photovoltaic device is used and includes applications in which the photovoltaic device 2 is used at room temperature and temperature above or below room temperature. It should be appreciated that where the one of the amorphous layer 10 and the multilayer stack 12 is deposited in the vacuum, and immediately after the deposition of the underlying semiconductor layer 6, an undesirable exposure to oxygen is avoided.

The rate of deposition of one of the amorphous layer 10 and the multilayer stack 12 may be between about 10 nm/minute and about 800 nm/minute, more particularly between about 100 nm/minute and 600 nm/minute, and most particularly between about 300 nm/minute and 500 nm/minute, as nonlimiting examples. A skilled artisan may select other deposition temperatures and rates within the scope of the disclosure.

In order to maintain the deposited one of the amorphous layer 10 and the multilayer stack 12 at ambient temperature, the photovoltaic device 2 may be cooled during the deposition process. For example, the photovoltaic device 2 may be in communication with a heat sink configured to maintain the temperature at ambient temperature throughout the deposition process. In another example, the photovoltaic device 2 may be handled in a refrigerated environment. Other means for regulating the temperature of the deposited one of the amorphous layer 10 and the multilayer stack 12 may also be used.

Any type of thin film deposition process suitable for deposition at the low temperature and the high rate of deposition may be used. For example, the one of the amorphous layer 10 and the multilayer stack 12 may be deposited by one of sputtering, evaporation, and electroplating. Where sputtering is employed, individual targets of Zn and Te may advantageously be employed when forming the multilayer stack 12, as opposed to the more costly targets comprising both Zn and Te that are used when forming the amorphous layer 10. Other suitable types of deposition for the one of the amorphous layer 10 and the multilayer stack 12 may also be employed, as desired.

The method 100 further includes a step 106 of applying an energy impulse 14 to a surface of the deposited one of the amorphous layer 10 and the multilayer stack 12. As illustrated in FIGS. 2 and 3, the energy impulse 14 may be provided by an energy impulse generator 26 in the same chamber 22 in which the deposition of the one of the amorphous layer 10 and the multilayer stack 12 is conducted. The energy impulse generator 26 subjects the one of the amorphous layer 10 and the multilayer stack 12 to the energy impulse 14 at a temperature equal to or greater than its critical temperature (T*). The application of the energy impulse 14 causes an explosive crystallization in a step 108, which forms the back contact layer 8 having the polycrystalline layer of ZnTe.

In another embodiment, the energy impulse 14 is provided by a residual heat from the deposition process, which is selected to initially deposit one of the amorphous layer 10 and the multilayer stack 12 in the amorphous form but not initiate the explosive crystallization in the step 108 until after the deposition has been completed.

The term "explosive crystallization" describes the rapid exothermic transformation of amorphous materials into their crystalline allotropes. As described in U.S. Pat. No. 4,783,379 to Wickersham et al., the entire disclosure of which is hereby incorporated herein by reference, the process of explosive crystallization results in the exothermic transformation of amorphous layers to polycrystalline layers with heat loss to the surroundings. The heat required to continue propagation of the transformation may be used to derive a relationship between the requisite layer thickness and the minimum ambient temperatures for explosive crystallization, according to the following Equation (1):

$$T^* = T_{mp} - H_c/C + E/(C^*\lambda)$$

where T* is the critical temperature for explosive crystallization, $T_{mp}$ is the film melting point, $H_c$ is the film heat of crystallization, C is the volume heat capacity of the amorphous film, E is the energy/unit area lost to the surroundings during explosive crystallization, and λ is the total film thickness prior to explosive crystallization.

As shown in FIG. 4, the appropriate thickness of the one of the amorphous layer 10 and the individual layers of the multilayer stack 12 is critical to the explosive crystallization. When forming the back contact layer 8 of polycrystalline ZnTe, and assuming E=0.02 J/cm$^2$, the thickness to which the one of the amorphous layer 10 and the individual layers of the multilayer stack 12 may be deposited is selected based on the material properties for amorphous layers and multilayer stacks of ZnTe, Zn, and Te as shown in the following TABLE 1.

TABLE 1

| Property | Zn/Te* | ZnTe | Cd/Te* | CdTe |
|---|---|---|---|---|
| $H_c$ (kJ/mole) | 119 | 56 | 102 | 57 |
| $H_c$ (kJ/cm$^3$) | 4.03 | 1.64 | 3.01 | 1.39 |
| ρ (g/cm$^3$) | 6.53 | 5.65 | 7.09 | 5.86 |
| $T_{mp}$ (K) | 693 | 1513 | 594 | 1370 |
| $C_p$ (J/g-K) | 0.26 | 0.16 | 0.21 | 0.21 |
| $C_p$ (J/cm$^3$-K) | 1.7 | 0.9 | 1.49 | 1.23 |
| k (W/cm-K) | 0.37 | 0.18 | 0.4 | 0.062 |
| λ+ (nm) @300 K | 59 | 365 | 78 | 2706 |

*for stoichiometric multilayer stack

In particular embodiments, the total thickness of the one of the amorphous layer 10 and the multilayer stack 12 is selected so that the critical temperature (T*) for explosive crystallization is high enough that the photovoltaic device 2 can be handled at room temperature, but low enough that the explosive crystallization can be initiated with the energy impulse 14. The one of the amorphous layer 10 and the multilayer stack 12 may be deposited to a total thickness between about 0.01 microns (10 nm) and 0.6 microns (600 nm). For example, the one of the amorphous layer 10 and the multilayer stack 12 may be deposited to the total thickness of about 0.04 microns (40 nm). It should also be understood that the use of the multilayer stack 12 of Zn and Te increases the free energy available for the explosive crystallization reaction, and thereby permits a reduction in the total thickness of the multilayer stack required for the explosive crystallization. The total thickness selected depends on the abovementioned variables under Equation (1), and may therefore be selected as desired.

With renewed reference to FIGS. 2 and 3, it should be appreciated that the energy impulse 14 may be localized. The term "localized" means that the energy impulse may not be applied across an entire surface area of the deposited one of the amorphous layer 10 and the multilayer stack 12 in order to cause the transformation to the polycrystalline form. Being localized, the energy impulse 14 may be applied as a single point location on the surface of the deposited one of the amorphous layer 10 and the multilayer stack 12. The point location may be adjacent an edge or corner of the surface of the deposited one of the amorphous layer 10 and the multilayer stack 12, which permits the point location to be removed by a subsequent edge delete process known in the art. As an alternative, the point location may be near a center of the surface of the deposited one of the amorphous layer 10 and the multilayer stack 12. Although the initiation point from which the wave propagates may be visible at the center of the surface, it should be understood that the initiation point is minor and does not impede the performance of the photovoltaic device 2. More than one point location for the energy impulse 14 may also be employed, as desired.

In one example, the energy impulse generator 26 includes a laser configured to provide a localized increase in temperature at the single point location, resulting in the explosive crystallization. In another example, the energy impulse generator 26 includes a mechanical stylus configured to provide a localized increase in pressure at the single point location, resulting in the explosive crystallization. It should be appreciated that the change in pressure at the single point location may be sufficient to raise the temperature at the single point location to the critical temperature (T*) under the right conditions under Equation (1). The mechanical stylus may include spring- or pneumatically-operated rod having a tapered end, which undergoes a punch-like motion when providing the localized increase in pressure at the single point location. Other means for providing the localized energy impulse 14 may also be used within the scope of the present disclosure.

The use of the system 20 and method 100 for manufacturing the photovoltaic device 2 with the polycrystalline ZnTe back contact layer 8, where ambient temperature deposition may be used to deposit amorphous layers prior to explosive crystallization, is more cost effective in comparison to known systems and methods, where high temperature furnaces have been to create layers with polycrystalline microstructure. Advantageously, the initiation of the explosive crystallization can be performed inside the deposition vacuum chamber 22, and does not require removal of the photovoltaic device 2 from the chamber 22 for subsequent processing to cause the formation of the polycrystalline microstructure. A complexity in manufacturing photovoltaic modules 2 with polycrystalline ZnTe back contact layers 8 is thereby minimized by the present invention.

While certain representative embodiments and details have been shown for purposes of illustrating the invention, it will be apparent to those skilled in the art that various changes may be made without departing from the scope of the disclosure, which is further described in the following appended claims.

What is claimed is:

1. A method for manufacturing a photovoltaic device, the method comprising the steps of:
   depositing one of (a) an amorphous layer including amorphous ZnTe and (b) a multilayer stack including alternating layers of Zn and Te, adjacent a semiconductor layer; and
   subjecting the one of (a) and (b) to an energy impulse at a temperature equal to or greater than its critical temperature for explosive crystallization to cause the explosive crystallization and form a polycrystalline layer.

2. The method of claim 1, wherein the semiconductor layer includes CdTe and the polycrystalline layer formed by the explosive crystallization includes polycrystalline ZnTe.

3. The method of claim 1, wherein the one of (a) and (b) is deposited under a vacuum.

4. The method of claim 1, wherein the one of (a) and (b) is deposited at ambient temperature.

5. The method of claim 4, wherein a substrate is cooled to room temperature during the deposition of the one of the amorphous layer and the multilayer stack.

6. The method of claim 1, wherein a rate of deposition is between about 10 nm/minute and about 800 nm/minute.

7. The method of claim 1, wherein the one of (a) and (b) is deposited to a total thickness between about 0.01 microns and 0.6 microns.

8. The method of claim 1, wherein the multilayer stack is formed by depositing layers of Zn and Te in an alternating fashion, the multilayer stack including a plurality of Zn layers and a plurality of Te layers.

9. The method of claim 1, wherein the one of (a) and (b) are deposited by a thin film deposition process.

10. The method of claim 9, wherein the thin film deposition process includes sputter deposition.

11. The method of claim 1, wherein the energy impulse is applied by a local application of one of heat and pressure to a surface of the one of the amorphous layer and the multilayer stack.

12. The method of claim 11, wherein the local of application of heat is applied by a laser.

13. The method of claim 11, wherein the local application of pressure is applied by a contacting of a mechanical stylus with the surface of the one of (a) and (b).

14. The method of claim 1, wherein the energy impulse is applied adjacent one of an edge and a center of the one (a) and (b).

* * * * *